United States Patent [19]

Miller

[11] Patent Number: 5,353,980

[45] Date of Patent: Oct. 11, 1994

[54] AFFIXING DIELECTRIC RESONATOR ON PCB

[75] Inventor: Susan C. Miller, Galmpton, United Kingdom

[73] Assignee: Northern Telecom Limited, Montreal, Canada

[21] Appl. No.: 63,492

[22] Filed: May 18, 1993

[30] Foreign Application Priority Data

Jul. 7, 1992 [GB] United Kingdom ............... 9214386.6

[51] Int. Cl.$^5$ .............................................. H05K 3/30
[52] U.S. Cl. ................... 228/124.1; 228/208; 228/123.1
[58] Field of Search ................. 228/121, 123.1, 124.1, 228/208, 262.2; 361/403, 409

[56] References Cited

U.S. PATENT DOCUMENTS

| | | | |
|---|---|---|---|
| 3,769,688 | 11/1973 | Kessler, Jr. et al. | 228/123.1 |
| 4,078,711 | 3/1978 | Bell et al. | 228/123.1 |
| 4,922,211 | 5/1990 | Otremba et al. | 331/68 |

FOREIGN PATENT DOCUMENTS

| | | | |
|---|---|---|---|
| 03192802 | 8/1991 | Japan | 228/124.1 |
| 2067117 | 7/1981 | United Kingdom | 228/123.1 |

OTHER PUBLICATIONS

IBM Technical Disclosure Bulletin, "Dummy Pads . . . ", vol. 20, No. 4, p. 1394, Sep. 1977.

Primary Examiner—Samuel M. Heinrich
Attorney, Agent, or Firm—Lee, Mann, Smith, McWilliams, Sweeney & Ohlson

[57] ABSTRACT

A method of affixing a passive dielectric component to a printed circuit board comprising the steps of forming a metallised area on the p.c.b. separate from the printed electrical circuitry, forming a like metallised area on the component, applying solder material to one of the metallised areas, placing the component on the metallised area on the board and reflowing the solder to create a metal-solder-metal bond between the component and the p.c.b. whereby the component is accurately aligned with respect to the printed electrical circuitry on the p.c.b.

4 Claims, 1 Drawing Sheet

DIELECTRIC RESONATOR

ETCHED DISC ON CIRCUIT BOARD

SPUTTERED METAL DISC

CIRCUIT BOARD

SOLDER

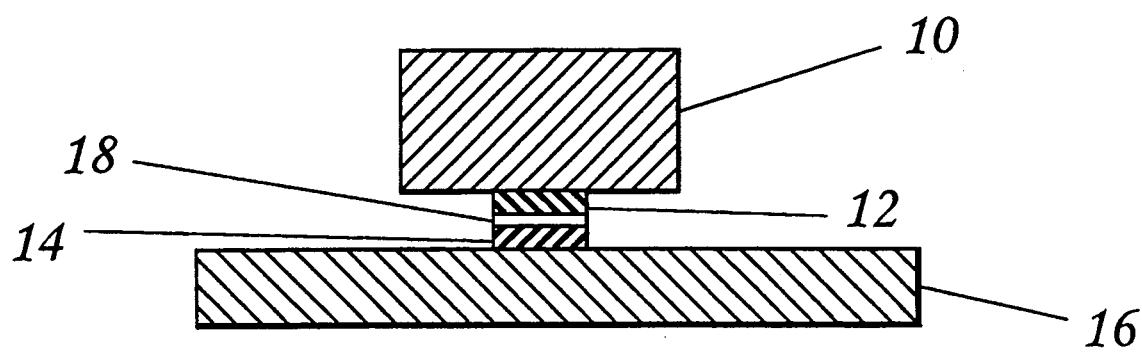
| 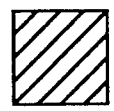 DIELECTRIC RESONATOR | 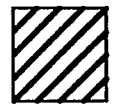 ETCHED DISC ON CIRCUIT BOARD |
|  SPUTTERED METAL DISC | 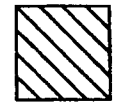 CIRCUIT BOARD |
| 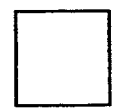 SOLDER | |

AFFIXING DIELECTRIC RESONATOR ON PCB

FIELD OF THE INVENTION

This invention relates to a method of affixing dielectric passive components on printed circuit boards.

Many modern printed circuit assemblies use surface mount technology to mount electronic components on a p.c.b. In this technology pads or lands formed as part of the etched printed circuit are coated with a solder paste and the components are placed in position. The assembly is then subjected to heating to cause so-called "reflow" of the solder paste to form a solder bond between the metallic contacts of the component and the pads on the board.

Where passive components which require no electrical connection with the printed circuit are required, it is common practice to deposit a small amount of adhesive, such as an epoxy resin, on the board and then place the passive component on the adhesive so that the component is, in effect, glued to the board. This technique has, however problems. Firstly the adhesive softens during the solder reflow operation, allowing the component to move out of the precise position in which it was placed initially. In mass production components are put in position by extremely accurate "pick and place" robotic machines, and the subsequent movement of a component such as dielectric resonator negates the accuracy obtainable from the machine. In the case of components such as dielectric resonators, which have no direct electrical connection to the board circuitry, accurate alignment can be critical. Secondly, in order to secure the component satisfactorily when it is put in place a certain amount of pressure is required to place the component in firm contact with the adhesive. Thirdly, the technique requires an additional operation in the process of assembling the product—namely the operation of applying the adhesive.

ACCORDING TO THE INVENTION

According to the present invention there is provided a method of affixing a passive dielectric component to a printed circuit board comprising the steps of forming a metallised area on the p.c.b., forming a similar metallised area on the component, applying solder to one of the metallised areas, placing the component on the metallised area on the board and reflowing the solder to create a metal-solder metal bond between the component and the p.c.b..

BRIEF DESCRIPTION OF THE DRAWINGS

An embodiment of the invention will now be described with reference to the accompanying drawings, which is a schematic representation of a component affixed to a p.c.b.

DESCRIPTION OF THE PREFERRED EMBODIMENT

A passive component 10, e.g. a circular dielectric resonator, which has no electrical connection, is provided with a metallic disc 12 or other suitable shape on a flat surface. The disc 12 may be formed by any suitable method e.g. by sputtering or evaporation. A planar metallic shape 14 is formed on the printed circuit board 16, as part of the conventional board manufacturing process, at the position where the resonator is to be affixed. During the step of screen printing other areas of the board with solder paste for fixing active surface mount components solder paste 18 is also deposited on the metallic disc 14. The resonator is then placed in position, along with the other components, and the complete assembly is then subjected to a solder reflow operation, e.g. by infra-red heating. During the reflow operation the solder material will melt and surface tension effects will ensure that the resonator is properly aligned with the metallic shape or pad 14 on the p.c.b.

While the invention requires the extra step of forming a metallic shape on the underside of the component, such components tend to be physically small and it is practical to load several hundred components into a reaction chamber for simultaneous metal disposition. The advantage of the invention is that the separate operation of deposition of adhesive is eliminated, the solder paste deposition can be part of the solder deposition step for other components or a solder shim put down by pick and place. Likewise the forming of the metallised area on the board can be part of the conventional printed circuit fabrication process. While a circular metallic disc is a convenient configuration for affixing a cylindrical dielectric resonator, other patterns of metallisation can be envisaged. For example, a broken ring can be used, the ring being broken to prevent induced electrical currents circulating in the ring. Other configurations include stellar shapes or a regular pattern of small spots. The invention is also applicable where spacers are required between a resonator and a p.c.b. A barium titanate resonator can be mounted on an intermediate electromagnetically inert dielectric spacer disc with solder paste interface between the spacer and the p.c.b., and dielectric adhesive between the resonator and the spacer. Alternatively the spacer could be a thin metal shim or washer which is surrounded by the solder.

I claim:

1. A method of affixing a passive dielectric component to a printed circuit board comprising the steps of forming a metallised area on the printed circuit board, forming a similar metallised area on a flat surface of the component, applying solder to one of the metallised areas, placing the metallised area of the component on the metallised area on the board and reflowing the solder to create a metal-solder-metal bond between the component and the printed circuit board, whereby the component is accurately aligned with respect to the printed electrical circuitry on the printed circuit board.

2. A method according to claim 1 wherein the similar metallised areas are corresponding discs.

3. A method according to claim 1 wherein the similar metallised areas are corresponding broken rings.

4. A method according to claim 1 wherein the similar metallised areas are corresponding patterns of spots.

* * * * *